(12) United States Patent
Shen et al.

(10) Patent No.: US 7,772,571 B2
(45) Date of Patent: Aug. 10, 2010

(54) IMPLANT BEAM UTILIZATION IN AN ION IMPLANTER

(75) Inventors: Cheng-Hui Shen, Taiwan (CN); Donald Wayne Berrian, Topsfield, MA (US); Jiong Chen, San Jose, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 102 days.

(21) Appl. No.: 11/868,851

(22) Filed: Oct. 8, 2007

(65) Prior Publication Data

US 2009/0090876 A1 Apr. 9, 2009

(51) Int. Cl.
*G21K 5/10* (2006.01)
*H01J 37/08* (2006.01)
*A61N 5/00* (2006.01)
*G21G 5/00* (2006.01)
*G06F 19/00* (2006.01)

(52) U.S. Cl. ............................. 250/492.21; 250/492.3; 700/98; 700/103; 700/109; 700/119

(58) Field of Classification Search .................. 700/95, 700/97, 98, 103, 108–110, 117–121; 250/492.2, 250/492.21, 492.3; 430/321
See application file for complete search history.

(56) References Cited

U.S. PATENT DOCUMENTS

| | | | |
|---|---|---|---|
| 3,541,328 A | 11/1970 | Enge | |
| 3,814,829 A | 6/1974 | Movchan et al. | |
| 4,105,890 A | 8/1978 | Movchan et al. | |
| 4,733,091 A * | 3/1988 | Robinson et al. | 250/492.2 |
| 4,980,556 A | 12/1990 | O'Connor et al. | |
| 4,980,562 A * | 12/1990 | Berrian et al. | 250/492.2 |
| 5,126,575 A | 6/1992 | White et al. | |
| 5,350,926 A | 9/1994 | White et al. | |
| 5,834,786 A * | 11/1998 | White et al. | 250/492.21 |
| 5,837,786 A | 11/1998 | Miyoshi et al. | |

(Continued)

FOREIGN PATENT DOCUMENTS

EP 0926699 6/1999

(Continued)

OTHER PUBLICATIONS

Aitken, D. (1986). "A new approach to ion implanter mass analysis optics," Vacuum 36(11/12):953-960.

(Continued)

*Primary Examiner*—Crystal J Barnes-Bullock
(74) *Attorney, Agent, or Firm*—Morrison & Foerster LLP

(57) ABSTRACT

To select a scan distance to be used in scanning a wafer with an implant beam, a dose distribution along a first direction is calculated based on size or intensity of the implant beam and a scan distance. The scan distance is the distance measured in the first direction between a first path and a final path of the implant beam scanning the wafer along a second direction in multiple paths. A relative velocity profile along the second direction is determined based on the dose distribution. Dose uniformity on the wafer is calculated based on the wafer being scanned using the relative velocity profile and the determined dose distribution. The scan distance is adjusted and the preceding steps are repeated until the calculated dose uniformity meets one or more uniformity criteria.

14 Claims, 6 Drawing Sheets

U.S. PATENT DOCUMENTS

| | | | |
|---|---|---|---|
| 6,160,262 | A | 12/2000 | Aoki et al. |
| 6,217,970 | B1 * | 4/2001 | Arita et al. ............... 428/848.1 |
| 6,232,619 | B1 * | 5/2001 | Chen et al. ..................... 257/48 |
| 6,545,580 | B2 | 4/2003 | Hegde et al. |
| 6,633,039 | B2 | 10/2003 | Sakai et al. |
| 6,677,599 | B2 * | 1/2004 | Berrian .................... 250/492.3 |
| 6,833,234 | B1 * | 12/2004 | Bloomstein et al. ......... 430/321 |
| 6,833,552 | B2 * | 12/2004 | Berrian .................... 250/492.3 |
| 6,918,351 | B2 * | 7/2005 | Chen et al. ............ 118/723 CB |
| 6,933,507 | B2 | 8/2005 | Purser et al. |
| 6,953,942 | B1 * | 10/2005 | Graf et al. ............... 250/492.21 |
| RE39,001 | E * | 3/2006 | Lundquist et al. ...... 219/121.72 |
| 7,057,192 | B2 * | 6/2006 | Kaim et al. ............. 250/492.21 |
| 7,059,817 | B2 | 6/2006 | Sieradzki et al. |
| 7,078,712 | B2 * | 7/2006 | Perel et al. ............. 250/492.21 |
| 7,078,713 | B2 | 7/2006 | White |
| 7,105,839 | B2 | 9/2006 | White |
| 7,112,789 | B2 | 9/2006 | White et al. |
| 7,161,161 | B2 | 1/2007 | Renau et al. |
| 7,166,854 | B2 | 1/2007 | Renau et al. |
| 7,253,424 | B2 | 8/2007 | Murrell et al. |
| 7,301,156 | B2 | 11/2007 | Purser et al. |
| 7,326,941 | B2 | 2/2008 | Chen et al. |
| 7,351,984 | B2 | 4/2008 | Purser et al. |
| 7,462,843 | B2 | 12/2008 | Chen et al. |
| 7,525,103 | B2 | 4/2009 | Purser et al. |
| 7,663,103 | B2 * | 2/2010 | Kuribara et al. ............. 250/310 |
| 2006/0017010 | A1 * | 1/2006 | Vanderberg et al. ...... 250/492.1 |
| 2006/0169924 | A1 | 8/2006 | Purser et al. |
| 2007/0023697 | A1 | 2/2007 | Purser et al. |
| 2007/0108390 | A1 | 5/2007 | Radovanov et al. |
| 2007/0187619 | A1 | 8/2007 | Kellerman et al. |
| 2008/0067434 | A1 * | 3/2008 | Walther et al. ......... 250/492.21 |
| 2008/0068678 | A1 * | 3/2008 | Suzuki et al. ............... 358/481 |
| 2008/0078953 | A1 * | 4/2008 | Gupta et al. ............. 250/492.21 |
| 2010/0061198 | A1 * | 3/2010 | Kawahara et al. ......... 369/13.01 |

FOREIGN PATENT DOCUMENTS

| | | |
|---|---|---|
| JP | 04192243 | 7/1992 |
| JP | 06005217 | 1/1994 |
| JP | 06124797 | 5/1994 |
| JP | 7071947 | 3/1995 |
| JP | 7302575 | 11/1995 |
| JP | 10302706 | 11/1998 |
| JP | 10308191 | 11/1998 |
| JP | 11126576 | 5/1999 |
| KR | 20050048589 | 5/2005 |
| RU | 2063108 | 6/1996 |
| RU | 2168233 | 5/2001 |
| RU | 2221307 | 1/2004 |
| SU | 370899 | 4/1979 |
| SU | 705699 | 12/1979 |
| SU | 1496616 | 7/1996 |
| WO | WO-2004008476 | 1/2004 |

OTHER PUBLICATIONS

Aitken, D. (1987). "The Precision Implant 9000 Beam Line," Nuclear Instruments and Methods in Physics Research, pp. 274-279.

Aitken, D. (1999). "A technique for production of multiple, large, mass analysed ribbon ion beams," IEEE, pp. 196-202.

Bayless et al. (1983). "Applications of RF Plasma Source Technology," Proc. Int'l Ion Engineering Congress, 2 pages.

Current et al. (1984). "Mapping of Ion Implated Wafers," In Ion Implantation: Science and Technology. J.F. Ziegler ed., Academic Press, Inc., pp. 487-536.

Graf et al. (1999). "A Global Model for BF3 Plasma in a RF-Driven Multicusp Ion Source," IEEE, pp. 300-303.

Hand et al. (Oct. 1959). "Magnetic Quadrupole with Rectangular Aperture," The Review of Scientific Instruments 30(10):937-930.

Kashy et al. (1987). "A Method for the Uniform Charged Particle Irradiation of Large Targets," Nuclear Instruments and Methods in Physics Research B26:610-613.

McKenna, C. ( ), "A Personal Historical Perspective of Ion Implantation Equipment for Semiconductor Applications," IEEE, pp. 1-17.

Mihara et al. (1991). "Parallel beam ion implanter: IPX-7000," Nuclear Instruments and Methods in Physics Research B55:417-422.

Purser et al. (1984). "Some Principles Underlying Ion Optics Design," In Ion Implantation: Science and Technology. J.F. Ziegler ed., Academic Press, Inc., pp. 433-486.

Sato et al. (1996). "A High Throughput Ion Implanter for AMLCD's," 1996 Int'l Workshop on Active-Matrix Liquid-Crystal Displays in conjunction with IDW'96, pp. 353-356.

Satoh et al. ( ). "An Unscanned, Mass-Analyzed Ion Implantation System for Flat-Panel Displays," IEEE pp. 138-141.

Scheerer et al. (1976). "The Multipole Element of the Q3D Spectrograph for Correction of the Kinematic Broadening," Nuclear Instruments and Methods 136:213-224.

Sherrill et al. (1989). "Use of Multipole Magnetic Fields for Making Uniform Irradiations," Nuclear Instruments and Methods in Physics Research B40:1004-1007.

Shimamura, K. (Oct. 1999). "Mass-Analyzed Ion Implanter with Parallel-Ribbon Beam for Flat Panel Displays," Mitsui Zosen Technical Review No. 168, pp. 16-21.

Sinclair et al. (1997). "Novel Ion Implanters for the Semiconductor Industry," in CP392, Application of Accelerators in Research and Industry. J.L. Duggan and I.L. Morgan (eds.) AIP Press, New York, pp. 1021-1024.

Takahashi et al. (1999). "Development of a large-area beam mass analyzer" IEEE, pp. 326-329.

White et al. (1999). "Positive Control of Uniformity in Ribbon Beams for Implantation of Flat-Panel Displays," IEEE, pp. 354-357.

White et al. (1999). "The Control of Uniformity in Parallel Ribbon Ion Beams up to 24 Inches in Size," In CP475, Applications of Accelerators in Research and Industry. J.L. Duggan and I.L. Morgan (eds.) The American Institute of Physics, pp. 830-835.

Yarling, C.B. (2000). "History of industrial and commercial ion implantation 1906-1978," J. Vac. Sci. Technol. A 18(4):1746-1750.

U.S. Appl. No. 60/511,417, "Multipole Lens and Methods for Accurate Collimation and Alignment of Scanned Beams," filed Oct. 15, 2003, for Nicholas R. White et al.

U.S. Appl. No. 60/369,322, "Controlling the Characteristics of Implanter Ion-Beams," filed Jul. 17, 2002, for Kenneth H. Purser et al.

U.S. Appl. No. 60/458,672, "Ion Beam Control Arrangement," filed Mar. 28, 2003, for Nicholas R. White.

* cited by examiner

IMPLANT BEAM UTILIZATION IN AN ION IMPLANTER

BACKGROUND

1. Field

The present application relates generally to ion implanters; more specifically, this application relates to implant beam utilization in ion implanters for introducing dopant materials into silicon wafers.

2. Related Art

Typically, an ion implanter for introducing dopant materials into silicon wafers and other work pieces may be modeled into an ion beam generation system and an implant station where individual wafer(s) are mounted on the surface of an electrostatic chuck or a rotating disc that is scanned through the incoming ion beam. Because of larger and larger wafer sizes, the recent semiconductor processes have moved towards processing one wafer at a time, in so-called single-wafer systems.

Traditional single-wafer ion implanters move the wafer in one direction past a fan shaped ion beam and an ion beam scan in a single axis. The scanning beam generation results in very low beam currents at low energies (200 to 5000 eV), which is unsuitable for high-dose or high-current ion implanters. Traditional high-current ion implanters achieve a relatively short beam line by placing a large number of wafers on a wheel and simultaneously spinning and radially moving the wheel through the ion beam. The multiple-wafer wheel makes an ion implanter undesirably large as the wafer size increases.

One approach to single-wafer ion implantation employs a so-called ribbon ion beam. The ribbon ion beam has a width that is at least as great as the diameter of the wafer, and the wafer is mechanically moved in a direction perpendicular to the longer dimension of the ribbon beam cross-section, in order to distribute the ions over the wafer's surface. In particular, the ribbon beam is required to be highly uniform across its width. Compensation components and adjustment procedures are required to provide a uniform beam over a range of beam parameters. However, it is difficult, if not impossible, to set up low-energy ribbon beams that meet the required levels of uniformity in both beam intensities and angles.

A single wafer implanter typically scans in 2 directions that are substantially perpendicular to each other to ensure implant dose uniformity on the wafers. These two scans are composed of either beam scanning cross one direction of a wafer and one mechanical scan in another direction of the wafer or two dimensional mechanical scan (for example, spin wheel+moving motion for a batch machine).

Because of the difficulties of setting up uniform ribbon beams, unacceptable low beam currents with scanning beam approach, and too large system size of a batch type implanter, a pure two mechanical reciprocal motions in two orthogonal directions cross a wafer surface was introduce into commercial high current ion implanters, which is called a 2D mechanical scan ion implanter. A 2D mechanical scan ion implanter typically scans a wafer completely out of the beam from one end to another in both directions to ensure the desired implanted dose uniformity. The total area of the beam irradiating is much greater than the wafer surface area. Beam utilization is defined as a ratio of the wafer surface area to the total beam irradiating area. Therefore, there is a need of improved wafer scanning systems and methods that would provide uniform implants with good beam utilization in the 2D scan single-wafer ion implanter.

SUMMARY

In one exemplary embodiment, to select a scan distance to be used in scanning a wafer with an implant beam, a dose distribution along a first direction is calculated based on size or intensity of the implant beam and a scan distance. The scan distance is the distance measured in the first direction between a first path and a final path of the implant beam scanning the wafer along a second direction in multiple paths. In one exemplary embodiment, the scan distance is less than the sum of the height of implant beam and the diameter of the wafer. A relative velocity profile along the second direction is determined based on the dose distribution. Dose uniformity on the wafer is calculated based on the wafer being scanned using the relative velocity profile and the determined dose distribution. The scan distance is adjusted and the preceding steps are repeated until the calculated dose uniformity meets one or more uniformity criteria.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous exemplary configurations, parameters, and the like. It should be recognized, however, that such description is not intended as a limitation on the scope of the present invention, but is instead provided as a description of exemplary embodiments.

Figure 1:
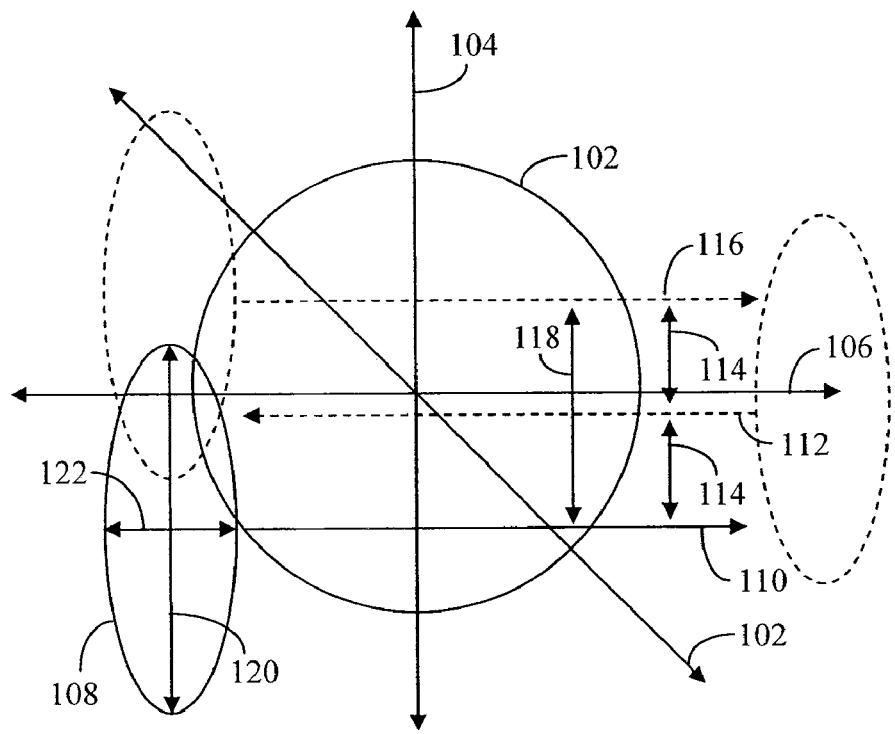
FIG. 1 depicts a implant beam scanning a wafer.

FIG. 1 depicts a wafer 102 to be implanted with dopant material. As depicted in FIG. 1, a first direction 104 and a second direction 106 along the surface of wafer 102 can be defined. First direction 104 and second direction 106 are about perpendicular to each other. It should be recognized, however, that first direction 104 and second direction 106 need not be precisely perpendicular. Also, while first direction 104 and second direction 106 are depicted as being vertical and horizontal, respectively, they can have various orientations.

To implant dopant material onto wafer 102, an implant beam 108 is scanned across wafer 102. In the present embodiment, implant beam 108 is scanned across wafer 102 in multiple paths. For example, FIG. 1 depicts implant beam 108 scanned across wafer 102 in three paths. In particular, FIG. 1 depicts implant beam 108 being scanned along second direction 106 in path 110. After scanning implant beam 108 in path 110, wafer 102 is moved along the first direction 104 by a scan step 114. Implant beam 108 is then scanned along second direction 104 in path 112. After scanning implant beam 108 in path 112, wafer 102 is moved along the first direction 104 by scan step 114. Implant beam 108 is then scanned along second direction 104 in path 116.

It should be recognized that implant beam 108 can be scanned across wafer 102 by: a) moving wafer 102 in second direction 106 while keeping implant beam 108 stationary; b) moving implant beam 108 in second direction 106 while keeping wafer 102 stationary; or c) moving wafer 102 and implant beam 108 in second direction 106. Although implant beam 108 is depicted as having an elliptical shape, it should be recognized that implant beam 108 can have various shapes.

A scan distance 118 defines the distance by which wafer 102 is moved along first direction 104 between a first path and a final path of implant beam 108 scanning wafer 102 along second direction 106 in multiple paths. For example, FIG. 1 depicts implant beam 108 scanning wafer 102 in three paths. Thus, path 110 in FIG. 1 corresponds to the first path of the multiple paths, and path 116 corresponds to the final path of the multiple paths. Thus, as depicted in FIG. 1, scan distance 118 defines the distance along first direction 104 between path 110 (i.e., the first path) and path 116 (i.e., the final path). Typically, the scan distance is the sum of the height of implant beam 108 and the diameter of wafer 102 to ensure dose uniformity through wafer 102. This, however, results in poor beam utilization. Thus, as noted earlier, it is desirable to select a scan distance to increase beam utilization while maintaining dose uniformity on wafer 102.

In one exemplary embodiment, rather than moving wafer 102 in discrete steps (i.e., using multiple scan steps as described in the above example), wafer 102 can be moved along first direction 104 with a velocity. At the same time, implant beam 108 is scanned across wafer 102 in second direction 106 in two paths. Thus, implant beam 108 is scanned across wafer 102 in a raster-like pattern.

Figure 2:
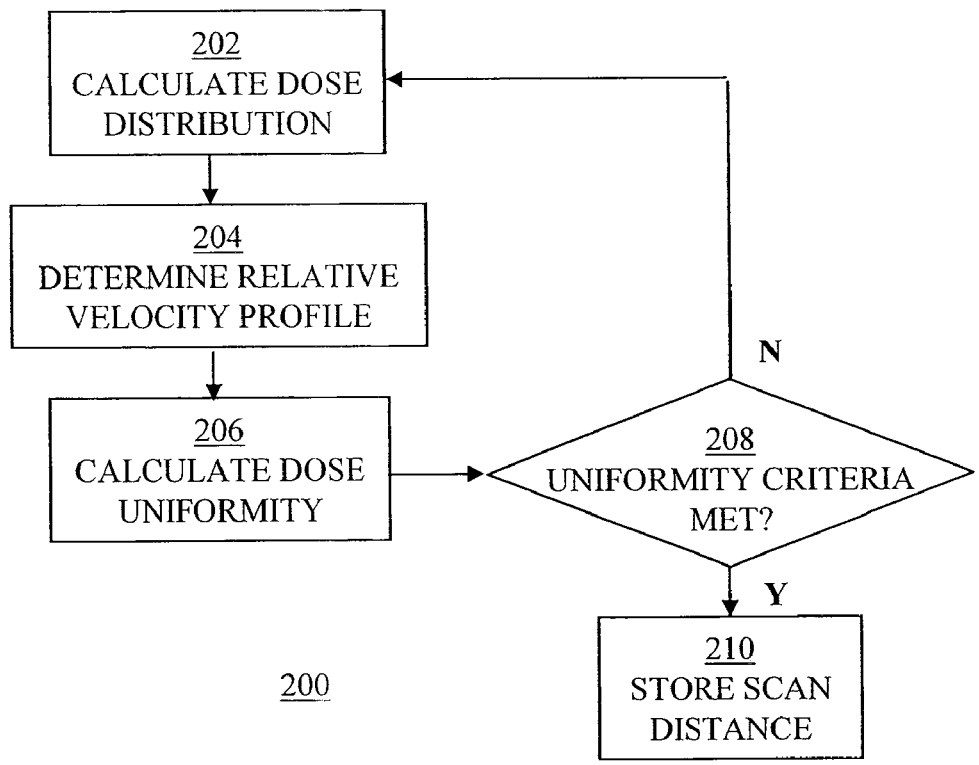
FIG. 2 depicts an exemplary process of determining a selected scan distance to be used in scanning a wafer with an implant beam.

FIG. 2 depicts an exemplary process 200 for determining a selected scan distance to be used in scanning a wafer with the implant beam. For the sake of clarity, the following description of exemplary process 200 is provided in conjunction with FIG. 2. Additionally, as is well known to one skilled in the arts, exemplary process 200 can be implemented as computer-executable instructions contained on a computer-readable storage medium.

FIG. 2 depicts an exemplary process 200 for determining a selected scan distance to be used in scanning a wafer with the implant beam. For the sake of clarity, the following description of exemplary process 200 is provided in conjunction with FIG. 2.

In step 202, a dose distribution along first direction 104 across wafer 102 is calculated based on size or intensity of implant beam 108 and a scan distance 118. In particular, the dose distribution can be calculated based on: a) size of implant beam 108 and scan distance 118; b) intensity of implant beam 108 and scan distance 118; or c) size and intensity of implant beam 108 and scan distance 118.

The size of implant beam 108 can be defined using any one or more dimensions of implant beam 108. For example, as depicted in FIG. 1, the size of implant beam 108 can be defined by beam height 120 and/or beam width 122. Beam height 120 corresponds to the size of implant beam 108 measured in first direction 108. Thus, the dose distribution along first direction 140 can be calculated based on beam height 120 and scan distance 118. Beam width 122 corresponds to the size of implant beam 108 measured in second direction 106. Thus, the dose distribution along first direction 140 can be calculated based on beam width 122 and scan distance 118.

In addition to or in place of the size of implant beam 108, intensity information of implant beam 108 can be used in calculating the dose distribution along first direction 104. Intensity information, such as dose rates, of implant beam 108 can be obtained by measuring the intensity information, estimating the intensity information, or using the intensity information specified for the ion implanter. The intensity information throughout implant beam 108, such as at various points along the width and/or height of implant beam 108 can be obtained. Alternatively, the intensity information only at the edges or envelope of implant beam 108 can be obtained.

Figure 3:
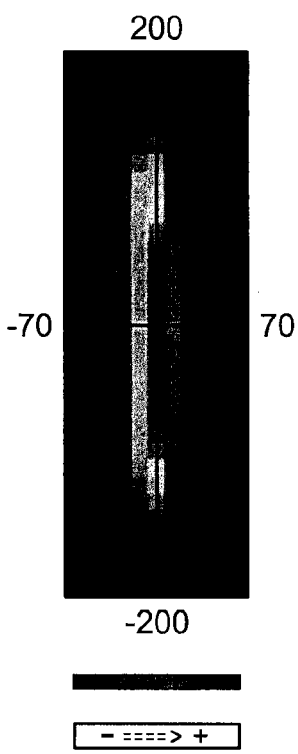
FIG. 3 depicts an exemplary implant beam shape.
Figure 4:
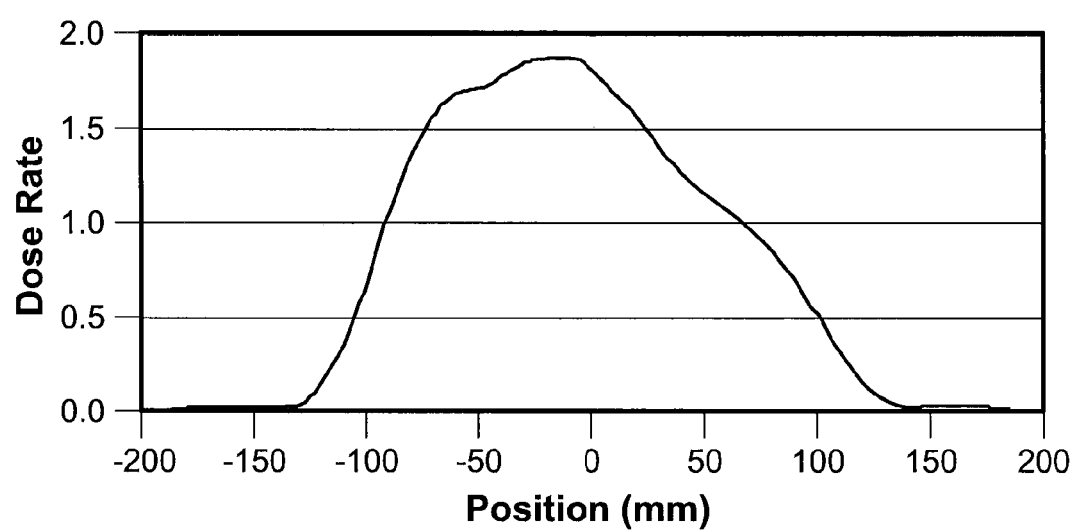
FIG. 4 depicts dose rates along various points on the first direction of an implant beam.

FIG. 3 depicts the size and two-dimensional intensity distribution of an exemplary implant beam. Each square in FIG. 3 is 13×13 mm. FIG. 4 depicts a graph of dose rates along various width of the exemplary implant beam depicted in FIG. 3.

As described above, scan distance 118 is the distance measured in direction 104 between a first path and a final path of implant beam 108 scanning wafer 102 along second direction 106 across wafer 102 in multiple paths.

As noted above, wafer 102 can be moved in first direction 104 in scan steps 114. In this case, the dose distribution along first direction 104 can be calculated based on scan step 114 in addition to size or intensity of implant beam 108 and scan distance 118. Note, if only two paths are used to scan implant beam 108 across wafer 102, then scan step 114 is the same as scan distance 118.

As also noted above, wafer 102 can be moved in first direction 104 with a velocity in first direction 104. In this case, the dose distribution along first direction 104 can be calculated based on the velocity in first direction 104 in addition to size or intensity of implant beam 108 and scan distance 118.

Figure 5:
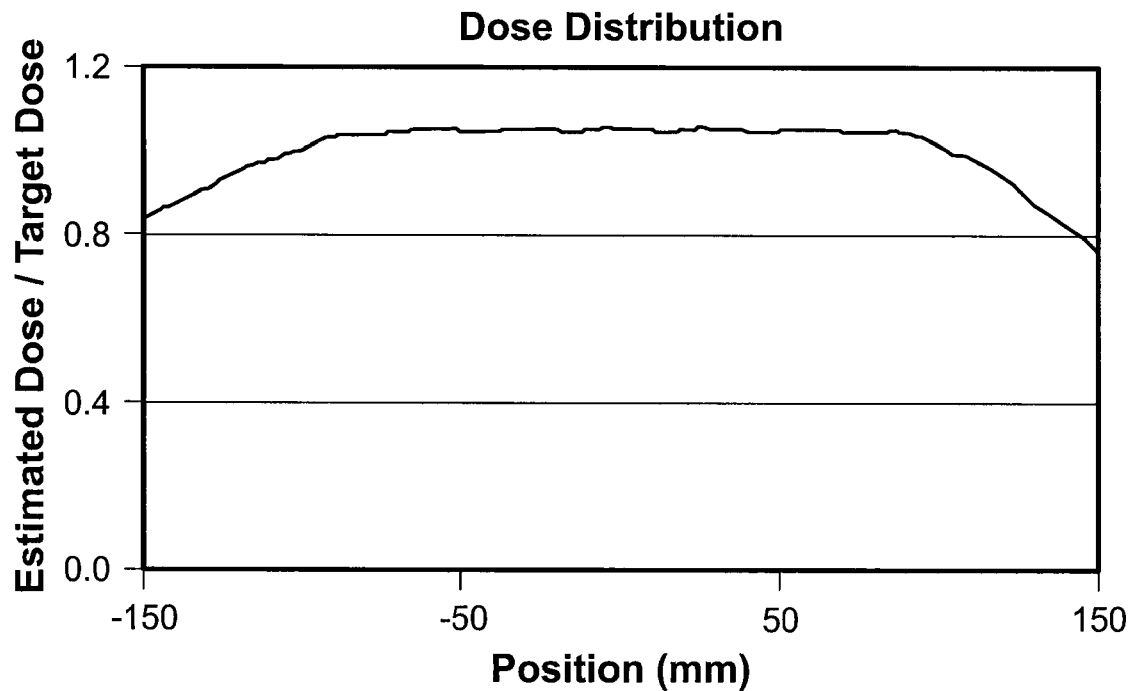
FIG. 5 depicts an exemplary dose distribution.

FIG. 5 depicts an exemplary graph of dose distribution across a 300 mm wafer using a scan distance of 360 mm. As can be seen in FIG. 5, the dose distribution is uneven, particularly near the edges of the wafer, which are under dosed compared to the center of the wafer.

With reference again to FIG. 1, as noted above, implant beam 108 can be scanned across wafer 102 by moving implant beam 108 in second direction 106 while keeping wafer 102 stationary or also moving wafer 102 in second direction 106. In this configuration, the areas on wafer 102 covered by implant beam 108 are determined. The total scan areas can be roughly calculated by multiplying scan distance 118 by the width of the multiple paths in second direction 106.

With reference again to FIG. 2, in step 204, a relative velocity profile along second direction 106 is determined based on the dose distribution calculated in step 202. As will be described in more detail below, the relative velocity profile is used in scanning wafer 102 with implant beam 108 along second direction 106.

In the present exemplary embodiment, the relative velocity profile is not constant along second direction 106 of wafer 102. Instead, the relative velocity along second direction 106 is varied in order to compensative for non-uniformity in the dose distribution calculated in step 202. For example, as discussed above, FIG. 5 depicts a dose distribution where the edges of the wafer are under dosed. To compensate, the relative velocity near the edges of the wafer can be lower than the relative velocity near the center of the wafer.

With reference again to FIG. 2, in step 206, dose uniformity on wafer 102 is calculated based on the wafer being scanned using the relative velocity profile and the dose distribution calculated in step 202. Note, the dose uniformity can be calculated without actually implanting dopant material on wafer 102. Instead, the dose uniformity can be calculated based on a model or simulation of the implantation process.

In the present exemplary embodiment, the dose uniformity is calculated along a third direction 116 on wafer 102. As depicted in FIG. 1, third direction 116 lies about 45 degrees between the first and second directions. It should be recognized, however, that third direction 116 can lie anywhere along wafer 102, including collinearly with first direction 104 or second direction 106.

In step 208, steps 202-206 are repeated until the dose uniformity determined in step 206 meets one or more uniformity criteria. In repeating steps 202-206, the scan distance used in step 202 is adjusted. In particular, the scan distance can be increased from a small initial value, such as near zero, to a large initial value.

In step 210, when the dose uniformity determined in step 206 meets one or more uniformity criteria, the scan distance used in step 202 is stored as the selected scan distance. For example, assume that steps 202-206 are repeated three times before the one or more uniformity criteria are met. Thus, the value of the scan distance used in step 202 in the third iteration is the value stored as the selected scan distance.

After the selected scan distance has been determined and stored, one or more actual wafers can be implanted using the selected scan distance and the relative velocity profile. In particular, to implant wafer 102 with dopant material, implant beam 108 is scanned across wafer 102 along second direction 106 in first path 110 using the relative velocity profile. Concurrently, wafer 102 is moved in first direction 104 until wafer 102 has been moved in first direction 104 by the selected scan distance. After wafer 102 has been moved in first direction 104 by the selected scan distance, wafer 102 is then rotated by a discrete amount, such as 3, 15, 30, 45, or 90 degrees. Implant beam 108 is then scanned again across wafer 102 along second direction 106 using the relative velocity profile, while wafer 102 is moved in first direction 104 until wafer 102 has been moved in first direction 104 by the selected scan distance.

Figure 6:
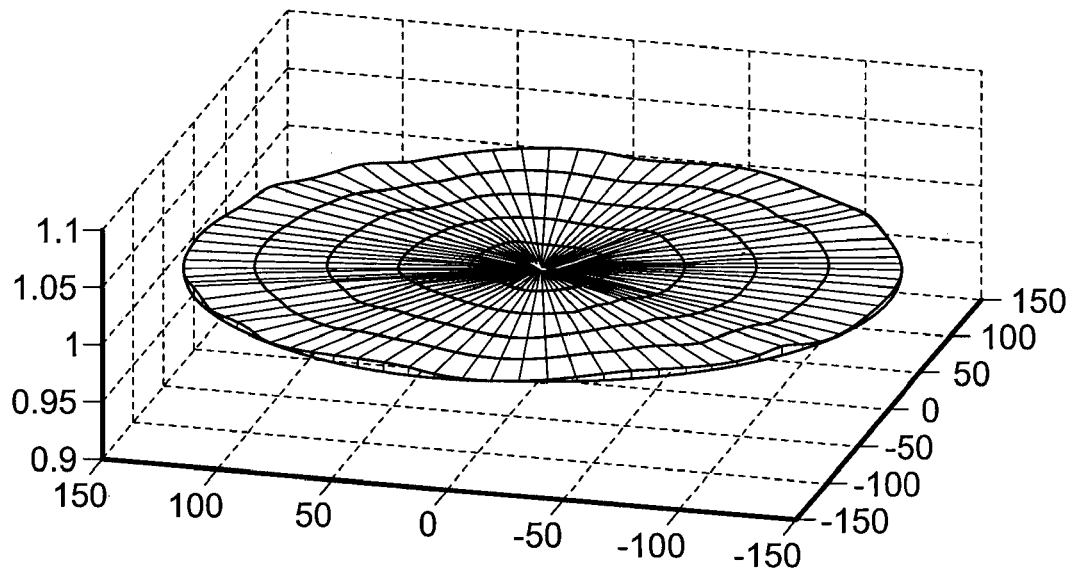
FIG. 6 depicts the result of a simulation of scanning an implant beam across a wafer.

FIG. 6 depicts the results of a simulation of scanning an implant beam across a wafer in two paths using a scan distance of 540 mm. The calculated uniformity is about 0.29%.

Figure 7:
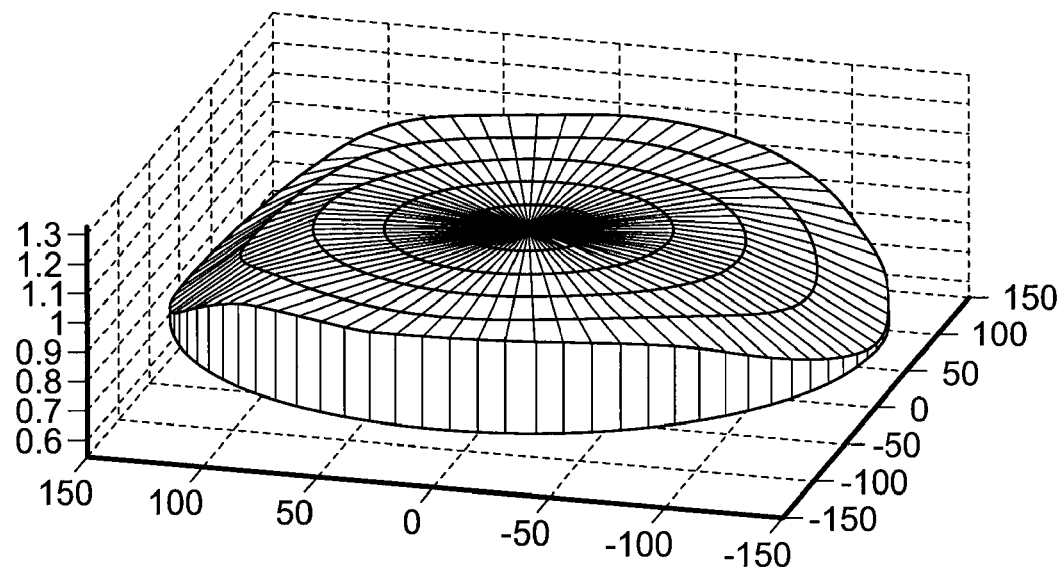
FIG. 7 depicts the result of another simulation of scanning an implant beam across a wafer.

FIG. 7 depicts the results of a simulation of scanning an implant beam across a wafer at a constant relative velocity in the second direction using a scan distance of 360 nm. As can be seen in FIG. 7, there is considerable non-uniformity near the edges of the wafer. Note, the extent of the non-uniformity near the edges increased with the decrease in scan distance.

Figure 8:
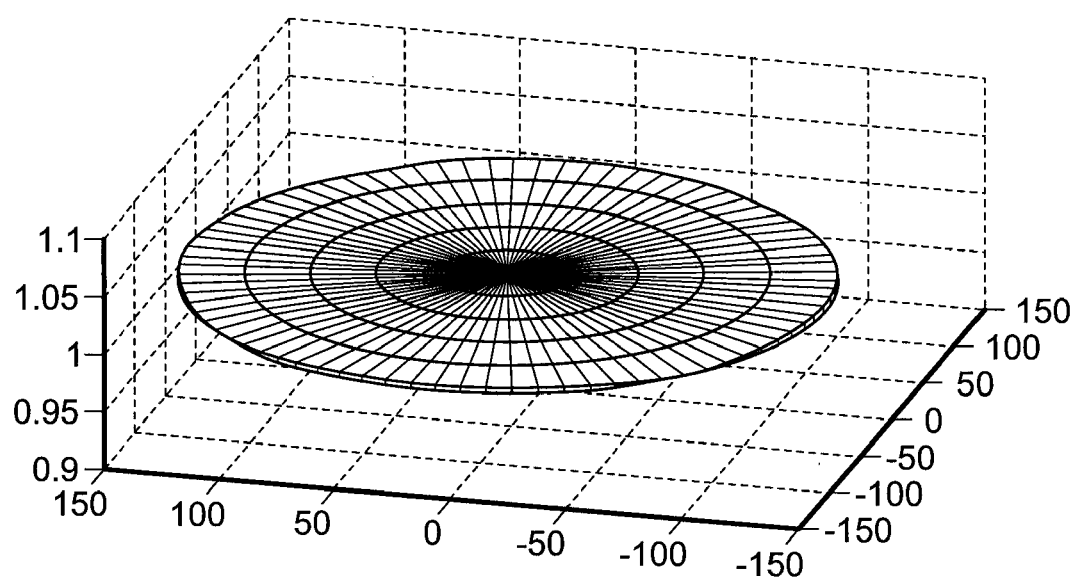
FIG. 8 depicts the result of still another simulation of implementing the exemplary process depicted in FIG. 2.

FIG. 8 depicts the results of a simulation of implementing exemplary process 200 (FIG. 2). In this example, the wafer was rotated to three positions (90, 180, and 270 degrees). It should be recognized, however, that the wafer can be rotated to any number of positions by various amounts (e.g., 0, 45, 90 and 135 degrees; 0, 3, 90 and 93 degrees; 0, 30, 60, 90, 120 and 150 degrees; or 0, 30, 50, 90, 120, 140, 180 and 210 degrees). Note, each set of positions includes pairs of about 90 degrees, such as 0 and 90, 45 and 35, 3 and 93, 30 and 120, 60 and 150, 50 and 140, and 120 and 210. At each position, the implant beam is scanned across the wafer along the second direction using the relative velocity profile. The scan distance used in this example is 360 mm. The calculated uniformity is about 0.13%.

Figure 9:
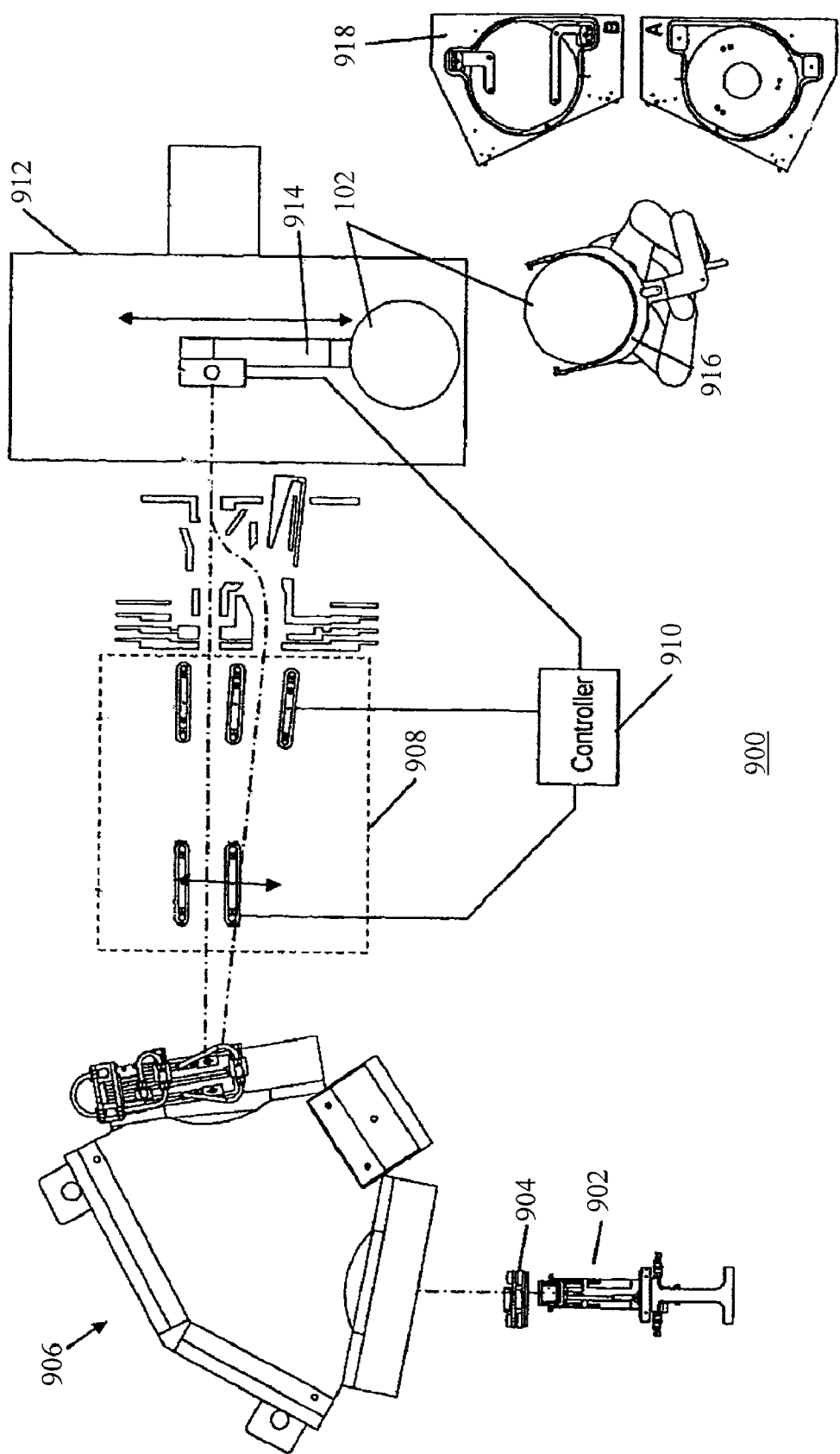
FIG. 9 depicts an exemplary implanter system.

FIG. 9 depicts an exemplary implanter system 900 to implant dopant material on one or more wafers 102 using the exemplary processes described above. Implanter system 900 includes a source 902, extraction optics 904, analyzer magnets 906, focusing system 908, controller 910, and target chamber 912. An individual wafer is held, positioned, and translated in target chamber 912 using an arm 914. Wafers are transported between target chamber 912 and one or more load ports 918 using robot arm 916. For a more detailed description of implanter system 900, see U.S. patent application Ser. No. 11/209,476, which is incorporated herein by reference in its entirety for all purposes.

Figure 10:
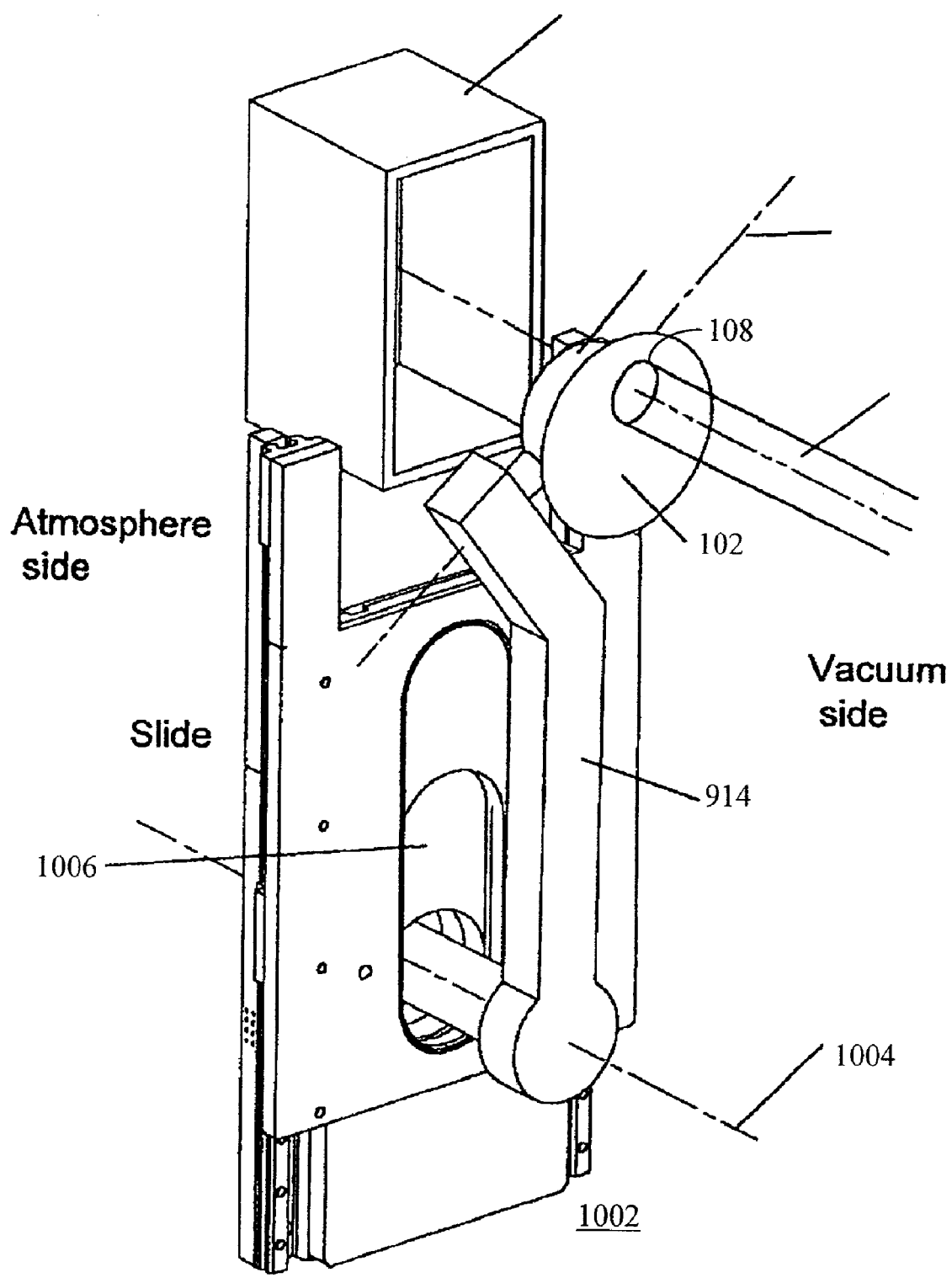
FIG. 10 depicts an exemplary scanning system.

FIG. 10 depicts an exemplary scanning system 1002 used in implanter system 900 (FIG. 9). Scanning system 1002 includes arm 914 that rotates about axis 1004. Arm 914 also moves along slide 1006. Thus, the combined rotation and translation of arm 914 allows for implant beam 108 to scan wafer 102. For a more detailed description of a scanning system, see U.S. patent application Ser. No. 11/049,264, which is incorporated herein by reference in its entirety for all purposes.

As noted earlier, it should be recognized that the implant beam 108 can be moved instead of or in addition to moving wafer 102. Also, although an exemplary implanter system 900 and exemplary scanning system 1002 have been depicted and described above, it should be recognized that the processes described above can be implemented using various types of implanter systems and scanning systems.

Although only certain exemplary embodiments have been described in detail above, those skilled in the art will readily appreciate that many modifications are possible in the exemplary embodiments without materially departing from the novel teachings and advantages of this invention. Accordingly, all such modifications are intended to be included within the scope of this invention.

We claim:

1. A method of determining a selected scan distance to be used in scanning a wafer with an implant beam, the method comprising:
   a) calculating a dose distribution along a first direction across the wafer based on size or intensity of the implant beam and a scan distance, wherein the scan distance is the distance measured in the first direction between a first path and a final path of the implant beam scanning the wafer along a second direction across the wafer in multiple paths, wherein the scan distance is less than the sum of the height of the implant beam and the diameter of the wafer, and wherein the first and second directions are about perpendicular;
   b) determining a relative velocity profile between the implant beam and the wafer along the second direction based on the dose distribution determined in step a), wherein the relative velocity profile is to be used in scanning the wafer with the implant beam along the second direction in multiple paths, wherein the relative velocity profile is not constant along the second direction across the wafer;
   c) calculating a dose uniformity on the wafer based on the wafer being scanned using the relative velocity profile and the dose distribution calculated in step a);
   d) repeating steps a)-c) until the calculated dose uniformity meets one or more uniformity criteria, wherein the scan distance is adjusted in repeating steps a)-c); and
   e) when the calculated dose uniformity does meet one or more uniformity criteria, storing the scan distance used in step a) as the selected scan distance.

2. The method of claim 1, wherein the scan distance is increased in repeating steps a)-c).

3. The method of claim 1, further comprising:
   before a), obtaining the beam height and a beam width, wherein the beam width is the size of the implant beam measured in the second direction, and wherein the obtained beam height and width are used in calculating the dose distribution in step a).

4. The method of claim 1, further comprising:
before a), determining areas on the wafer covered by the implant beam, wherein the determined areas are used in calculating the dose distribution in step a).

5. The method of claim 1, wherein a velocity of the implant beam along the first direction is used in calculating the dose distribution in step a).

6. The method of claim 1, wherein a scan step is used in calculating the dose distribution in step a), wherein the scan step is the distance between two subsequent paths of the multiple paths.

7. The method of claim 1, wherein the dose uniformity is determined along a third direction across the wafer, wherein the third direction lies about 45 degrees between the first and second directions.

8. The method of claim 1, further comprising:
after storing the selected scan distance:
f) scanning the wafer with the implant beam along the second direction using the relative velocity profile between the implant beam and the wafer determined in step b);
g) concurrently with f), moving the wafer in the first direction until the wafer has been moved in the first direction by the selected scan distance;
h) after g), rotating the wafer by a discrete amount; and
i) after h), repeating steps f) and g).

9. The method of claim 8, wherein the implant beam is kept stationary while the wafer is moved to scan the wafer with the implant beam in step f).

10. The method of claim 8, wherein the implant beam is moved while the wafer is kept stationary to scan the wafer with the implant beam in step f).

11. The method of claim 8, wherein the wafer is moved with a velocity along the first direction in step g).

12. The method of claim 8, wherein the wafer is moved with a step size along the first direction in step g), wherein the wherein the scan step is the distance between two subsequent paths of the multiple paths.

13. A computer-readable storage medium containing computer-executable instructions for determining a selected scan distance to be used in scanning a wafer with an implant beam, comprising instructions for:
a) calculating a dose distribution along a first direction across the wafer based on size or intensity of the implant beam and a scan distance, wherein the scan distance is the distance measured in the first direction between a first path and a final path of the implant beam scanning the wafer along a second direction across the wafer in multiple paths, wherein the scan distance is less than the sum of the height of the implant beam and the diameter of the wafer, and wherein the first and second directions are about perpendicular;
b) determining a relative velocity profile between the implant beam and the wafer along the second direction based on the dose distribution determined in step a), wherein the relative velocity profile is to be used in scanning the wafer with the implant beam along the second direction in multiple paths, wherein the relative velocity profile is not constant along the second direction across the wafer;
c) calculating a dose uniformity on the wafer based on the wafer being scanned using the relative velocity profile and the dose distribution calculated in step a);
d) repeating steps a)-c) until the calculated dose uniformity meets one or more uniformity criteria, wherein the scan distance is adjusted in repeating steps a)-c); and
e) when the calculated dose uniformity does meet one or more uniformity criteria, storing the scan distance used in step a) as the selected scan distance.

14. An implanter system to implant dopant material on a wafer, comprising:
a source of an implant beam;
a focusing system configured to focus the implant beam;
a target chamber configured to translate the wafer in a first direction until the wafer has been moved in the first direction by a selected scan distance; and
a controller configured to scan the implant beam across the wafer in the target chamber in a second direction using a relative velocity profile, which is not constant along the second direction across the wafer,
wherein the selected scan distance and the relative velocity profile were determined by:
a) calculating a dose distribution along the first direction across the wafer based on size or intensity of the implant beam and a scan distance, wherein the scan distance is the distance measured in the first direction between a first path and a final path of the implant beam scanning the wafer along the second direction across the wafer in multiple paths, wherein the scan distance is less than the sum of the height of the implant beam and the diameter of the wafer, and wherein the first and second directions are about perpendicular;
b) determining the relative velocity profile between the implant beam and the wafer along the second direction based on the dose distribution,
c) calculating a dose uniformity on the wafer based on the wafer being scanned using the relative velocity profile and the dose distribution;
d) repeating a)-c) until the calculated dose uniformity meets one or more uniformity criteria, wherein the scan distance is adjusted in repeating a)-c); and
e) when the calculated dose uniformity does meet one or more uniformity criteria, the scan distance used in a) being the selected scan distance.

* * * * *